US007639012B2

(12) United States Patent
Habara et al.

(10) Patent No.: US 7,639,012 B2
(45) Date of Patent: Dec. 29, 2009

(54) COIL APPARATUS AND MAGNETIC RESONANCE IMAGING APPARATUS USING THE SAME

(75) Inventors: Hideta Habara, Musashino (JP);
Yoshitaka Bito, Kokubunji (JP);
Yoshihisa Soutome, Tokyo (JP);
Hisaaki Ochi, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 141 days.

(21) Appl. No.: 12/071,795

(22) Filed: Feb. 26, 2008

(65) Prior Publication Data

US 2008/0315880 A1    Dec. 25, 2008

(30) Foreign Application Priority Data

Apr. 23, 2007    (JP)   ............................ 2007-113252

(51) Int. Cl.
*G01V 3/00*    (2006.01)
(52) U.S. Cl. ........................................ 324/318; 324/322
(58) Field of Classification Search ......... 324/300–322; 600/407–435
See application file for complete search history.

(56) References Cited

U.S. PATENT DOCUMENTS

| | | | | |
|---|---|---|---|---|
| 4,622,558 A | * | 11/1986 | Corum | .................. 343/742 |
| 4,916,418 A | | 4/1990 | Rath | |
| 5,309,104 A | * | 5/1994 | Frederick | ................. 324/318 |
| 5,347,220 A | * | 9/1994 | Van Heelsbergen | .......... 324/318 |
| 5,483,163 A | * | 1/1996 | Wen et al. | .................... 324/318 |
| 5,557,247 A | | 9/1996 | Vaughn, Jr. | |
| 5,578,925 A | * | 11/1996 | Molyneaux et al. | .......... 324/318 |
| 5,654,723 A | * | 8/1997 | Craven et al. | ................ 343/742 |
| 5,757,189 A | * | 5/1998 | Molyneaux et al. | .......... 324/318 |
| 6,060,882 A | * | 5/2000 | Doty | ........................... 324/318 |
| 6,100,694 A | | 8/2000 | Wong | |
| 2007/0229076 A1 | * | 10/2007 | Habara et al. | ................ 324/318 |
| 2008/0150533 A1 | * | 6/2008 | Habara et al. | ................ 324/318 |

* cited by examiner

*Primary Examiner*—Brij B Shrivastav
(74) *Attorney, Agent, or Firm*—Stites & Harbison PLLC; Juan Carlos A. Marquez, Esq.

(57) ABSTRACT

There is provided an RF coil capable of resonating or tuning two frequencies, having uniform spatial sensitivity and having a small spatially occupied volume, especially an RF coil suitable for a high magnetic field MRI apparatus. A coil apparatus is made up of a plurality of linear conductors 200, 201 arranged around a central axis and two ring conductors 202, 203 connected to the respective ends of the plurality of linear conductors 200, 201 and capacitors are inserted in the linear conductors 200, 201 and ring conductors 202, 203. The plurality of linear conductors are made up of conductors 200 located near the central axis and conductors 201 located far from the central axis and the ring conductors 202, 203 have star-like polygonal shape so that the linear conductors are arranged alternately. This structure can realize two tuning modes; a resonance mode similar to a birdcage type resonance mode and a resonance mode which becomes zero (node) in the vicinity of the linear conductor group 200 located near the central axis.

18 Claims, 15 Drawing Sheets

COIL APPARATUS AND MAGNETIC RESONANCE IMAGING APPARATUS USING THE SAME

CLAIM OF PRIORITY

The present application claims priority from Japanese application JP 2007-113252 filed on Apr. 23, 2007, the content of which is hereby incorporated by reference into this application.

BACKGROUND OF THE INVENTION

1. Field of the Invention

The present invention relates to a coil apparatus for transmitting/receiving electromagnetic waves and a magnetic resonance imaging apparatus using the same (hereinafter referred to as "MRI apparatus").

2. Background Art

MRI apparatuses are designed to irradiate an examinee placed in a uniform static magnetic field produced by a magnet with an electromagnetic field, excite nuclear spin in the examinee's body, then receive a nuclear magnetic resonance signal which is electromagnetic wave produced by the nuclear spin and image the examinee. Irradiation of the electromagnetic wave and reception of the nuclear magnetic resonance signal are realized by an RF coil which transmits or receives radio frequency (RF) electromagnetic waves and transmission coils, reception coils or dual-function coils in variety of shapes suitable for MRI apparatuses have been developed.

A signal measured by an MRI apparatus is usually signals from hydrogen nuclei contained in water or fat. In recent years, the magnetic field of such MRI apparatuses has been intensified and sensitivity has been improved. As a result, it is possible to acquire signals of nuclei other than hydrogen (called "signals from other nuclides"). For example, signals from nuclei such as phosphorus, carbon, fluorine and sodium can be acquired. It is expected that acquisition of information on muscle or protein that relates metabolism of will be available by imaging signals of phosphorus and carbon.

MRI signals from other nuclides are generally as extremely weak as on the order of $1/10$ to $1/100$ or less of an MRI signal of hydrogen, and it is thereby difficult to obtain detailed images. Therefore, it is a general practice to display MRI signals from other nuclides with low resolution superimposed on morphologic images created from the MRI signal of hydrogen. In this case, the MRI signal of hydrogen and MRI signals of other nuclides are preferably acquired simultaneously or successively.

Since the coil used for MRI transmission/reception has high frequency selectivity, the coil to acquire an MRI signal of hydrogen and the coil to acquire signals of other nuclides are normally set independently each other. Attempts to make one type of coil tune two frequencies have also been made.

For example, Patent Document 1 discloses a method of tuning two or more frequencies using an RF coil made up of a plurality of conductors called "rung" arranged in an axial direction between concentrically arranged single cylinders under a scheme of multiple patch resonators. Furthermore, Patent Document 2 discloses a scheme of tuning two or more frequencies by connecting inductor/capacitor resonant circuits in parallel with birdcage type coil rungs. Furthermore, Patent Document 3 discloses a scheme of tuning a birdcage type coil with two or more frequencies by providing a plurality of sets of portion called "end ring."

[Patent Document 1] U.S. Pat. No. 5,557,247

[Patent Document 2] U.S. Pat. No. 4,916,418

[Patent Document 3] U.S. Pat. No. 6,100,694

SUMMARY OF THE INVENTION

Multiple patch resonator and birdcage type coils are generally known as coils having a uniform sensitivity area and effective for accurately imaging target regions such as the human head. However, the method described in Patent Document 1 assigns rungs arranged in a circumferential direction to every other different frequency in the circumferential direction, and the method therefore has a disadvantage that the degree of uniformity in effective sensitivity decreases.

On the other hand, the method described in Patent Document 2 involves problems that adjustment of the circuit is complicated and the capacitance is too small to be applicable to a large coil such as a coil for imaging the body trunk using an MRI apparatus with a high magnetic field of 3 tesla or more. The method described in Patent Document 3 has a problem that since the end of the birdcage type coil is constructed of a plurality of sets of end rings, its longitudinal size increases and the shoulder part becomes narrow when the human head is placed in the coil.

It is an object of the present invention to provide a coil apparatus having a uniform sensitivity region and having two tuning frequencies and capable of transmitting/receiving MRI signals of two frequencies. Furthermore, it is another object of the present invention to provide a coil apparatus which has two tuning frequencies, the coil of which yet occupies almost the same space compared to one coil. It is a further object of the present invention to provide a coil apparatus compatible with an MRI apparatus with a high magnetic field. It is a still further object of the present invention to provide an MRI apparatus capable of acquiring a signal from hydrogen nucleus and signals from other nuclei in the same inspection process by mounting the above described coil apparatus.

In order to solve the above described problems, the present invention divides a plurality of linear conductors arranged around a central axis into two groups, arranges one group near the central axis and the other far from the central axis. These two groups of linear conductors are connected at both ends thereof using two loop-shaped conductors to form a coil apparatus. This structure realizes two tuning modes. One is a resonance mode similar to the conventional birdcage type resonance mode and has a sensitivity distribution on a plane cut perpendicular to the plurality of linear conductors at the center of the coil, which is uniformly distributed over the whole inside of a circle having a first radius centered on the central axis and the whole inside of a circle having a second radius. The other is a resonance mode in which a sensitivity distribution of the central part has zero (node) in the vicinity of the linear conductor group located closer to the central axis.

That is, the coil apparatus according to the present invention is a coil apparatus used for signal transmission and/or reception, including a plurality of linear conductors arranged around a central axis, loop-shaped first conductors connected to one respective ends of the plurality of linear conductors, loop-shaped second conductors connected to the respective other ends of the plurality of linear conductors, and capacitors arranged at least one of the linear conductors, first conductors and second conductors, wherein the plurality of linear conductors include a first linear conductor group and a second linear conductor group, the surface on which the first conductor group is arranged and the surface on which the second conductor group is arranged are located at a certain distance from each other, and the first conductors and the second conductors are connected alternately to the linear conductors making up the first linear conductor group and the linear conductors making up the second linear conductor group.

Alternatively, a coil apparatus used for signal transmission and/or reception, including a plurality of linear conductors arranged around a central axis, loop-shaped first conductors connected to one respective ends of the plurality of linear conductors, loop-shaped second conductors connected to the respective other ends of the plurality of linear conductors, and capacitors arranged at least one of the linear conductors, first conductors and second conductors, wherein the first conductors and the second conductors each have portions located near and far from the central axis and have rotational symmetry around the central axis. The plurality of linear conductors are connected to the portions of the first conductors and the second conductors located near and far from the central axis, respectively.

In the coil apparatus of the present invention, the arrangement of the capacitors may take various forms. For example, the capacitors may be arranged only on the first conductors and second conductors or only the linear conductors. Alternatively, the capacitors may be arranged on the first conductors, second conductors and linear conductors. When the capacitors are arranged on the linear conductors, the capacitors may be arranged only one of the two linear conductor groups. By differentiating the arrangement of the capacitors and the capacitance of each capacitor, it is possible to adjust a resonance frequency and constitute a coil having two different tuning modes.

The typical shape of the coil apparatus of the present invention is typically cylindrical and the shape of the first conductors and the second conductors is star shape. The coil apparatus of the present invention can take various shapes such as hollow truncated cone or circular shape in addition to cylindrical shape or can use a shape according to the use. Taking a cylindrical shape, the coil apparatus in an MRI apparatus may take a shape suitable for a coil for the human head or a coil for the whole body, for example.

In the coil apparatus of the present invention, power supplying/signal receiving means is provided in parallel with at least one of the capacitors inserted in the conductors. The power supplying/signal receiving means may be provided at two locations where circularly polarized wave can be supplied/received. This allows circularly polarized wave transmission or circularly polarized wave reception and improves sensitivity and efficiency.

The MRI apparatus of the present invention includes static magnetic field generating means for generating a static magnetic field, an RF coil, disposed in a space of static magnetic field generated by the static magnetic field generating means, for generating a high-frequency magnetic field in a direction perpendicular to the static magnetic field direction or detecting a high-frequency magnetic field in a direction perpendicular to the static magnetic field direction, and means for imaging internal information of the examinee using a nuclear magnetic resonance signal generated from the examinee placed in the space of the static magnetic field and detected by the RF coil, wherein the above described coil apparatus of the present invention is provided as the RF coil. The RF coil may be any RF coil for transmission, for reception or for transmission/reception.

Furthermore, in the MRI apparatus of the present invention, the RF coil includes first and second tuning modes of different frequencies, wherein the capacitors are adjusted so that any one of the first and second tuning modes tunes a resonance frequency of hydrogen nucleus and the other tunes a resonance frequency of nucleus other than hydrogen nucleus.

The present invention provides a coil apparatus which causes one coil to have a uniform sensitivity region and tune two frequencies. This allows the same coil in the MRI apparatus to detect NMR signals from two types of nucleus and realizes measurement of different types without moving the inspection target.

Furthermore, the coil apparatus of the present invention provides electromagnetic wave penetrability between the plurality of linear conductors arranged neighboring each other so as to allow an RF magnetic field to enter from outside. Therefore, the coil apparatus of the present invention can be used together with other transmission coils arranged outside. In an application to an MRI apparatus, RF transmission can be carried out using other large coils located outside and the coil apparatus of the present invention can be used as a reception-only coil.

Furthermore, the present invention can constitute an MRI apparatus having uniform sensitivity with two frequencies using the above described coil apparatus of the present invention in a relatively simple configuration as the RF coil of the MRI apparatus.

DETAILED DESCRIPTION OF THE PREFERRED EMBODIMENTS

Hereinafter, embodiments of the present invention will be explained with reference to the accompanying drawings.

Figure 1:
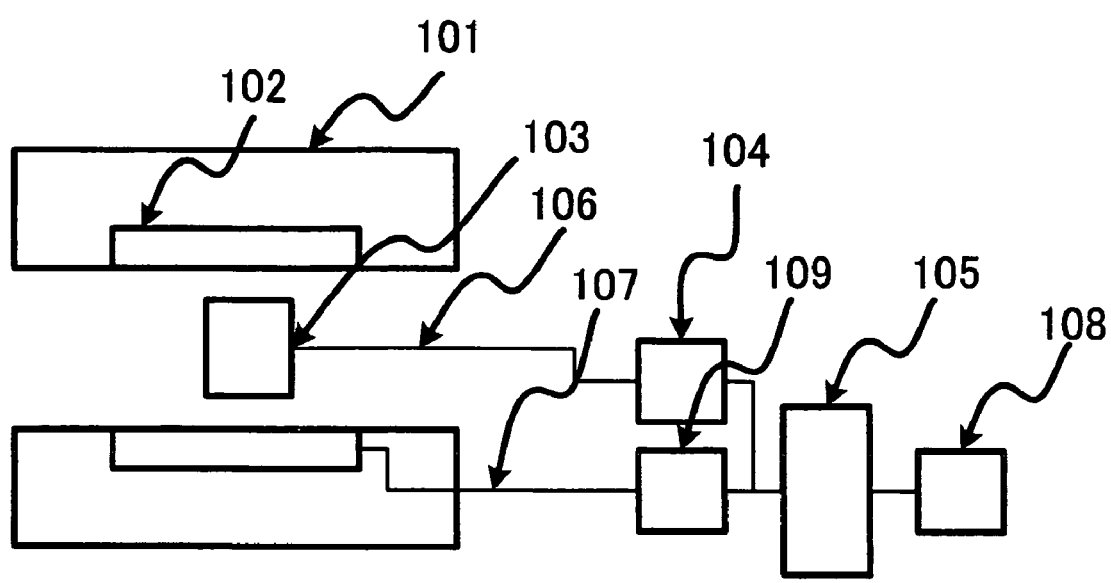
FIG. 1 shows an embodiment of an MRI apparatus to which the present invention is applied.

A first embodiment of the MRI apparatus of the present invention will be explained first. FIG. 1 is a schematic view of the MRI apparatus to which the present invention is applied.

This MRI apparatus is constructed of a magnet 101 which applies a static magnetic field to an examinee, a gradient magnetic field coil 102 which gives a predetermined magnetic gradient in a predetermined direction to the static magnetic field, an RF coil 103 inserted in the magnet 101 to transmit an electromagnetic wave such as radio wave to the examinee and receive an electromagnetic wave, a transmitter/receiver 104 connected to the RF coil 103 to create and transmit an electromagnetic wave to be irradiated from the RF coil, detect a nuclear magnetic resonance signal from the RF coil and process the signal, a gradient magnetic field power supply 109 which supplies a current to the gradient magnetic field coil 102, a data processing section 105 which controls driving of the transmitter/receiver 104 and the gradient magnetic field power supply 109 and carries out various types of information processing and operations by an operator, and a display 108 for displaying the processing results of the data processing section 105.

The gradient magnetic field power supply 109 and the gradient magnetic field coil 102 are connected via a gradient magnetic field control cable 107. Furthermore, the RF coil 103 and the transmitter/receiver 104 are connected via a cable for controlling the coil and a transmission/reception cable 106. Though not shown, the transmitter/receiver 104 is constructed of a synthesizer, power amplifier, reception mixer, analog to digital converter, transmission/reception changeover switch or the like.

The MRI apparatus adopts a horizontal magnetic field scheme or vertical magnetic field scheme depending on the direction of the static magnetic field generated by the magnet 101. In the case of the horizontal magnetic field scheme, the magnet 101 generally has a cylindrical bore and generates a static magnetic field in the horizontal direction in FIG. 1. On the other hand, in the case of the vertical magnetic field scheme, a pair of magnets are arranged above and below the examinee in the vertical direction and generates a static magnetic field in the vertical direction in FIG. 1. The present invention is applicable to any one of the two schemes.

The MRI apparatus configured as shown above irradiates the examinee (not shown) placed in a static magnetic field with an electromagnetic wave and a gradient magnetic field intermittently applied at intervals of approximately several milliseconds through the RF coil 103 and gradient magnetic field coil 102, receives a signal emitted from the examinee excited with the resonant electromagnetic wave, carries out signal processing and acquires a magnetic resonance image. The figure shows the single RF coil 103 as the RF coil which irradiates and receives an electromagnetic wave, but a plurality of RF coils such as an RF coil for wide range imaging and an RF coil for local imaging may also be used.

The MRI apparatus of the present invention uses a coil apparatus having two tuning frequencies which will be described later for any one of such RF coils. One of the tuning frequencies is a resonance frequency of nuclear spin, for example, of a hydrogen atom and the other is a resonance frequency of nuclear spin of any atom other than hydrogen such as carbon, sodium and phosphorus. These resonance frequencies depend on the strength of the static magnetic field, and in the case of an MRI apparatus having a magnetic field strength of 3 tesla, the frequency of an MRI signal of hydrogen is approximately 128 MHz, the frequency of an MRI signal of carbon is 32.2 MHz, that of a sodium signal is 33.9 MHz and that of a phosphorus signal is 51.8 MHz.

Using the coil apparatus having two tuning frequencies corresponding to two nuclides as the RF coil 103, the MRI apparatus of the present invention can acquire signals from two nuclei in the same inspection process. This allows a morphological image created using a signal from hydrogen to be displayed together with metabolic information created from a signal of phosphorus or carbon superimposed thereon. In this case, since there is little time difference when the morphological image is acquired and when the metabolic information is acquired, provided images contribute to an accurate inspection.

Acquiring signals from two nuclei requires not only that the RF coil 103 should support two frequencies but also that the transmitter/receiver 104 should be able to transmit/receive two frequencies. More specifically, of the synthesizer, power amplifier, reception mixer, analog/digital converter, quadrature detection circuit, transmission/reception changeover switch or the like that make up the transmitter/receiver 104, the synthesizer, power amplifier, reception mixer and transmission/reception changeover switch support two frequencies used and two systems of these components are provided.

During transmission, the transmission/reception changeover switch selects the synthesizer and power amplifier that generate the first or second frequency according to the frequency of nucleus to be measured and applies a high frequency which is the first or second frequency to the RF coil 103. During reception, the transmission/reception changeover switch selects the analog/digital converter and quadrature detection circuit and receives the signal detected by the RF coil 103.

Next, embodiments of the coil apparatus of the present invention will be explained.

First Embodiment

Figure 2:
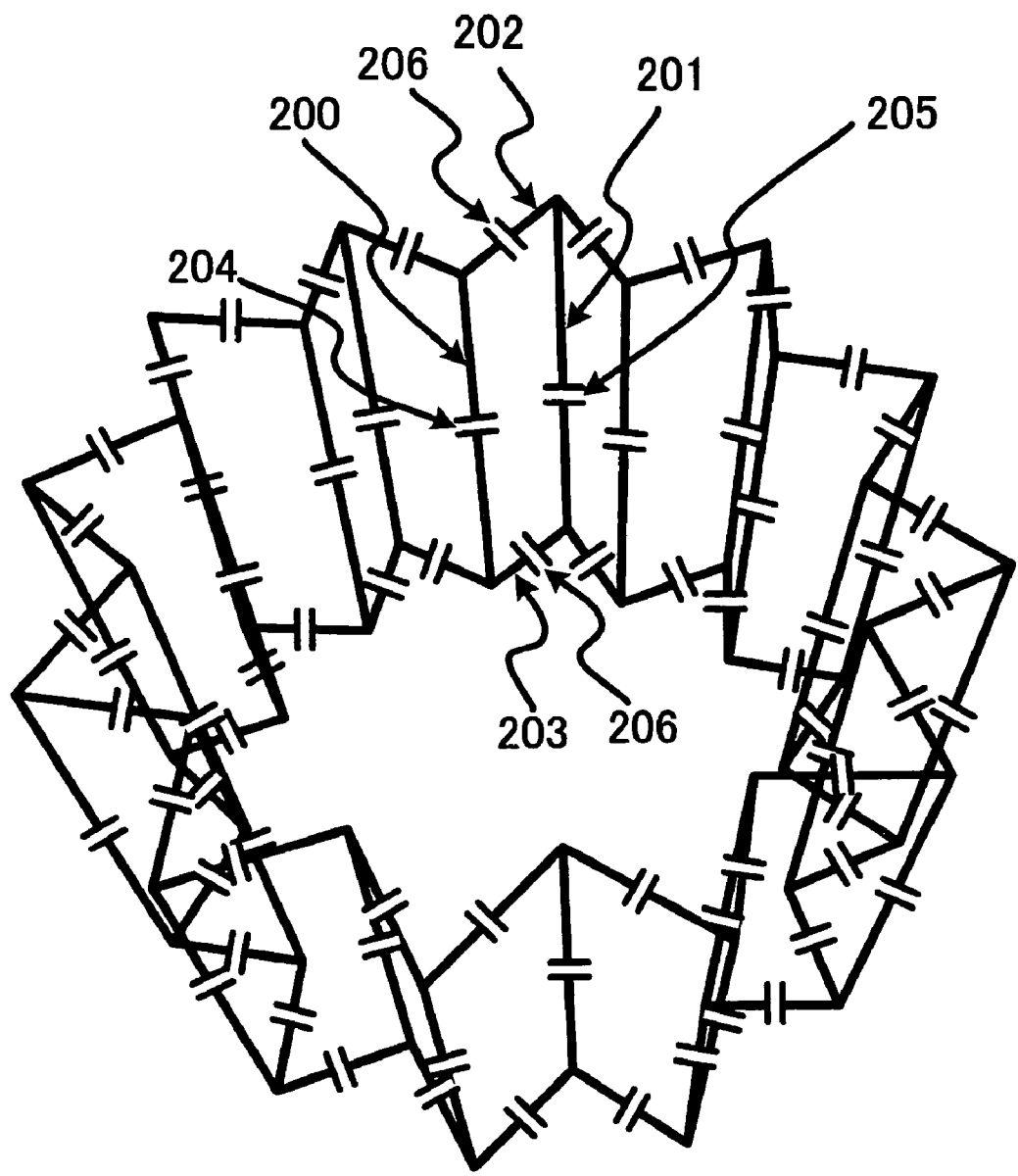
FIG. 2 shows a first embodiment of a coil apparatus of the present invention.

FIG. 2 shows an overall view of a first embodiment of the coil apparatus of the present invention. This coil apparatus is an RF coil suitable, for example, for a coil for the head of a horizontal magnetic field MRI.

The RF coil of this embodiment is constructed of a plurality of linear conductors 200, 201, first conductors 202 connected to one ends of these linear conductors 200, 201, second conductors 203 connected to the other ends of the linear conductors 200, 201, capacitors 204, 205 inserted in the linear conductors 200, 201 and capacitors 206 inserted in the first conductors 202 and second conductors 203, and has a cylindrical structure as a whole. The power supply circuit and/or power receiving circuit is omitted in FIG. 2, but the power supply circuit and/or power receiving circuit are added in parallel with any one of the capacitors 204 to 206.

The figure shows the case where the number of linear conductors is 24, but the number of linear conductors is not limited to 24 and may be at least 6. The preferable number linear conductors depends on the size of the coil, but it may be 16 or more when used as the coil for the head and more preferably 20 to 28.

The linear conductors 200, 201 can be divided into two types; those located near the center of the coil 200 (12 conductors in the example in the figure) and those located far from the coil 201 (likewise 12 conductors) and the linear conductors 200 and linear conductors 201 are located alternately. The first conductors 202 and second conductors 203 each have a star ring shape folded the same number of times as the number of linear conductors (24 here) and are connected to the linear conductors 200, 201 alternately disposed at the respective vertices. The capacitors 206 are disposed on the conductors between connections with the linear conductors. Hereinafter, the first conductors 202 and second conductors 203 will be referred to as "ring conductors."

When used as the coil for the head, the human head is inserted in this cylindrical structure and MRI imaging is performed. The size of the coil is not limited, but in the case of the coil for the head, the outer diameter of the whole is 340 mm, the inner diameter is 270 mm, the length in the axial direction is approximately 220 mm.

The conductor parts of the linear conductors 200, 201 and ring conductors 202, 203 can be constructed of a thin conductive metal sheet or conductive metal bar or pipe. Furthermore, when the RF coil is a coil for an MRI apparatus, all components of the coil are made of non-magnetic materials. This prevents image noise or distortion from occurring due to influences of parts. The conductor parts of the coil are supported by a supporter made of non-magnetic engineering plastic such as Delrin® or acryl.

As for the RF coil of this embodiment, since the connections of the ring conductors with the linear conductors are folded zig-zag to form star-like ring conductors, unlike the conventional birdcage type coil, a doughnut-shaped region is formed between a virtual cylinder (cylinder of a first radius) made up of the linear conductors 200 arranged near the coil center and a virtual cylinder (cylinder of a second radius) made up of the linear conductors 201 arranged far from the coil center. This adds a resonance mode having sensitivity nodes in the vicinity of the circumference having the first radius, causing, together with the conventional birdcage type tuning mode, two different resonance modes to coexist in one coil. Since the resonance mode having sensitivity nodes in the vicinity of the circumference of the first radius corresponds to a multiple patch resonator type resonance mode, this will be referred to as a "multiple patch resonator type mode" here.

Figure 3:
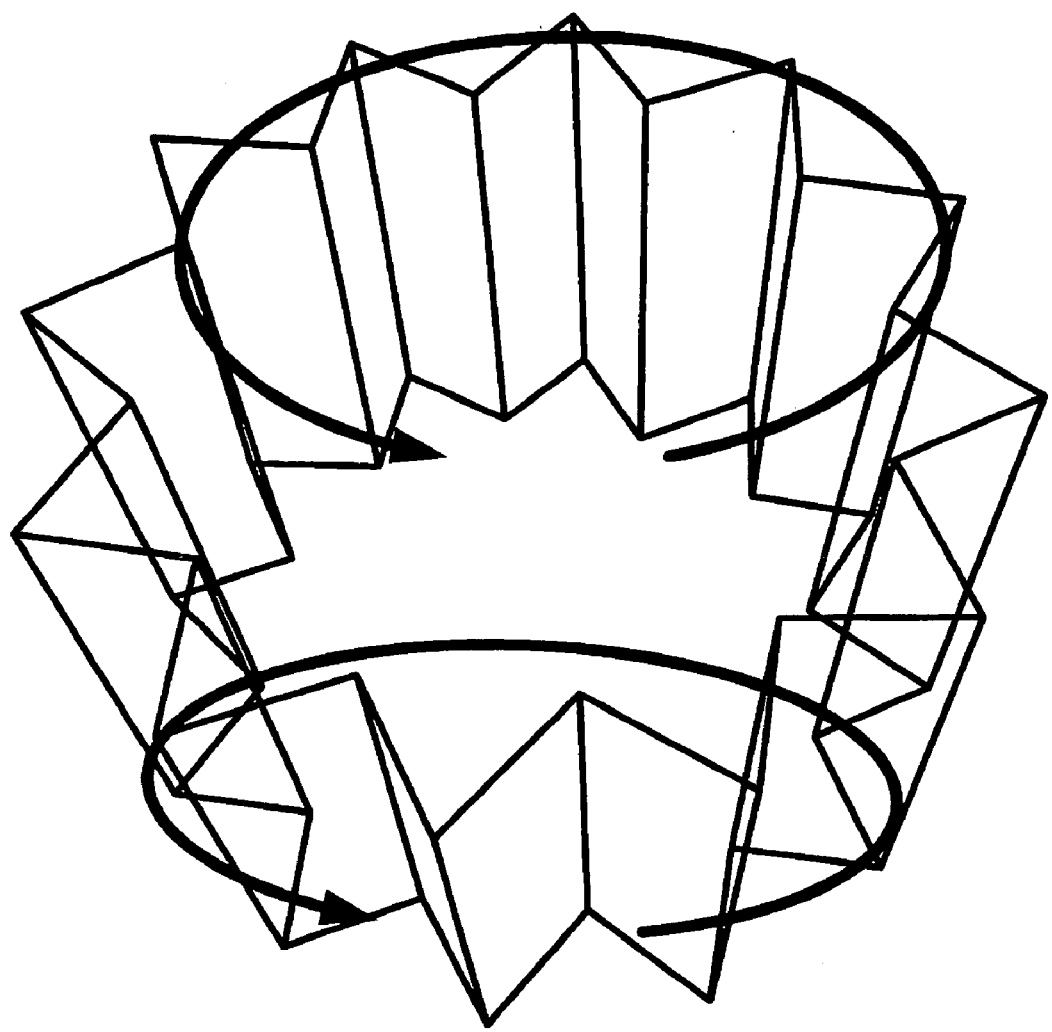
FIG. 3 is a schematic view of routes of currents flowing through coil conductors in a birdcage type resonance mode.
Figure 4:
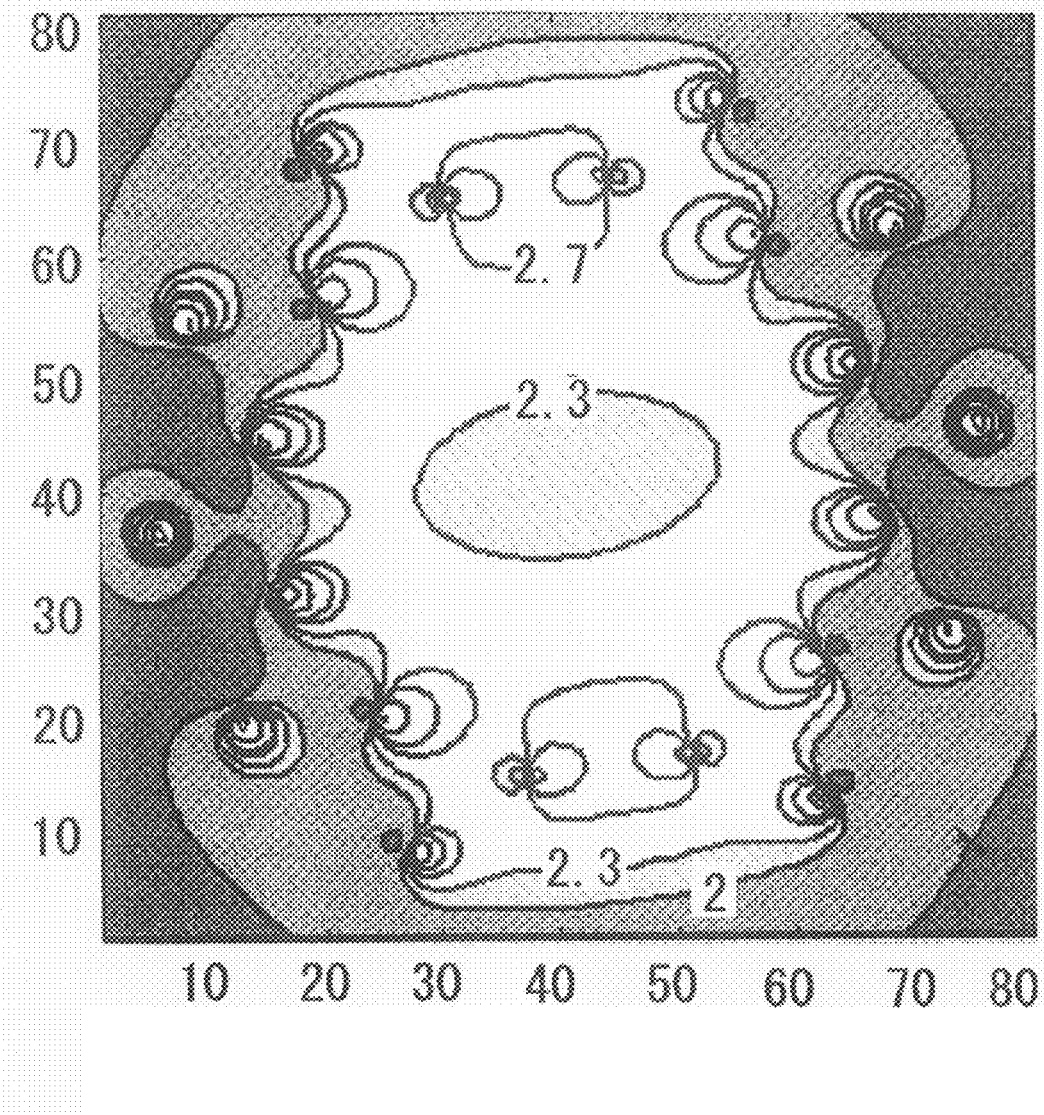
FIG. 4 shows a sensitivity distribution of the coil in the birdcage type resonance mode using contours.

The two resonance modes will be explained in further detail using FIGS. 3 to 6. FIG. 3 and FIG. 4 show a current flow in a birdcage type tuning mode and a sensitivity distribution thereof, while FIG. 5 and FIG. 6 show a current flow in a multiple patch resonator type mode and a sensitivity distribution thereof.

When birdcage type resonance occurs, if the cylindrical structure coil is divided into two portions on the plane including the central axis, a current in the same direction with intensity varying depending on the conductors flows through the plurality of linear conductors located on one side, while a current with intensity varying depending on the conductors flows opposite direction through the plurality of linear conductors located on the other side. Schematically, the currents flow as shown by elliptical arrows drawn in FIG. 3. In this case, the sensitivity distribution on the plane cut in the center of the coil perpendicular to the 24 linear conductors shows a uniform sensitivity distribution in the vicinity of the center as shown in FIG. 4. This is a sensitivity distribution of a coil suitable for an MRI that images an inspection target inserted in the cylindrical structure.

Figure 5:
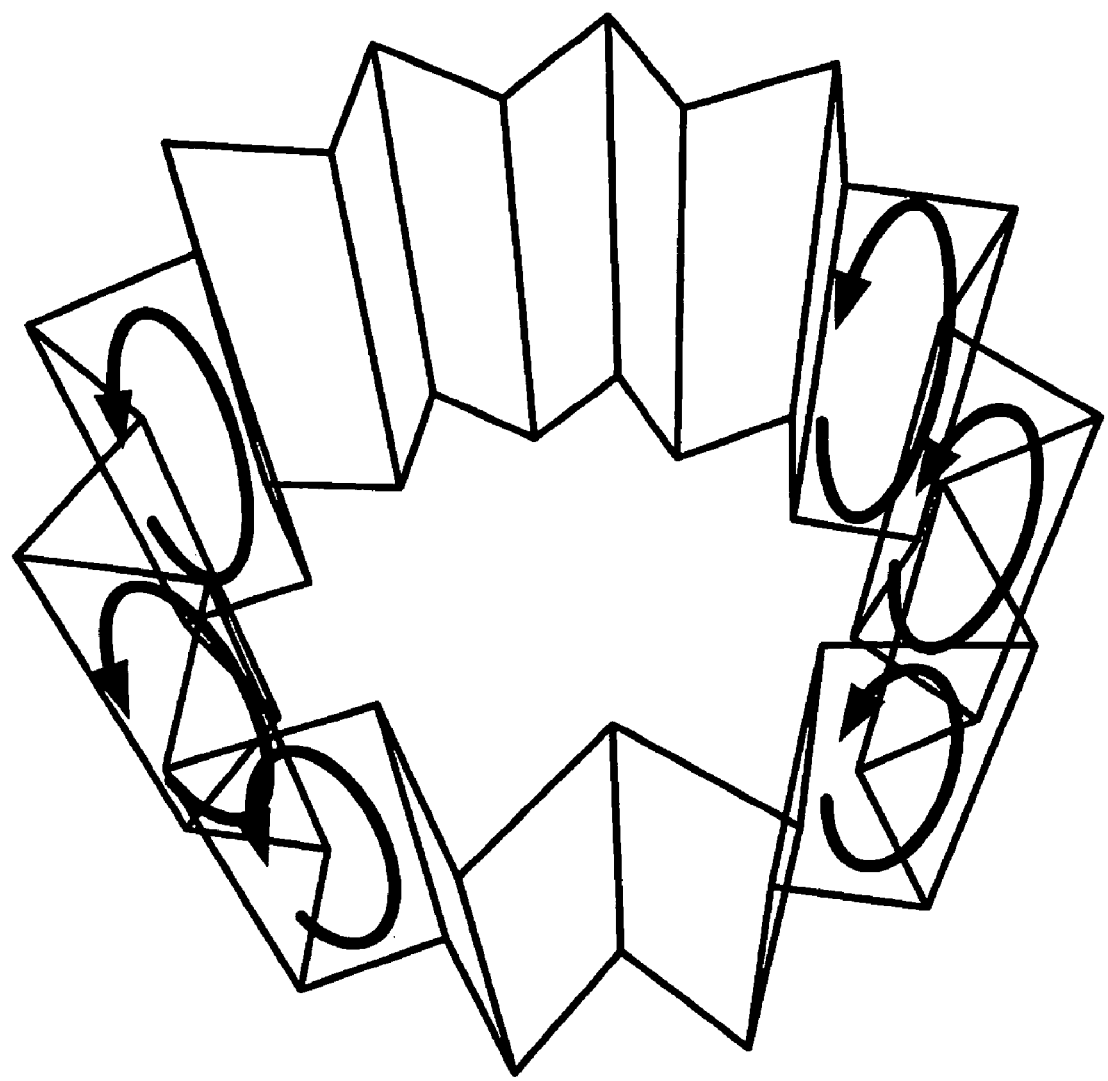
FIG. 5 is a schematic view of routes of currents flowing through coil conductors in a multiple patch resonator type mode.
Figure 6:
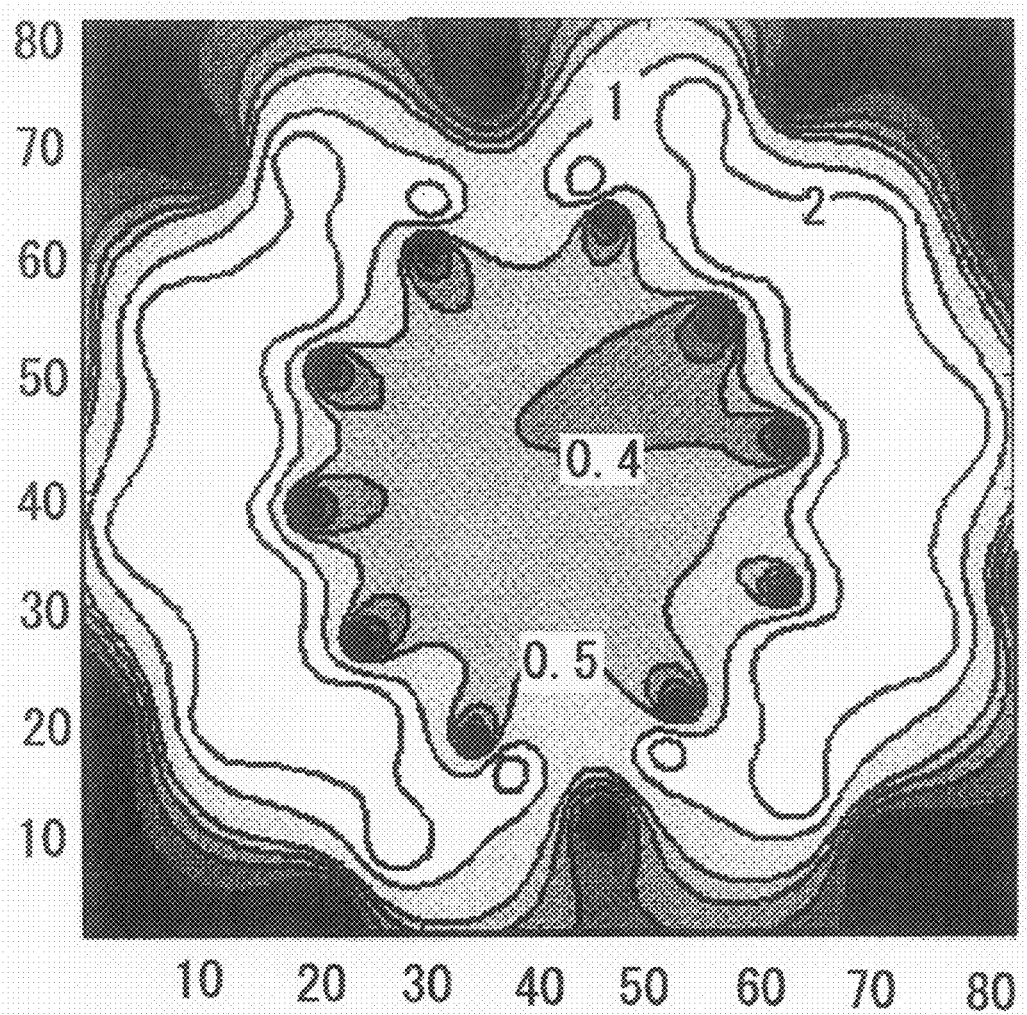
FIG. 6 shows a sensitivity distribution in the multiple patch resonator type mode using contours.

When multiple patch resonator type mode resonance has occurred, currents flow approximately along a loop made up of two neighboring linear conductors and ring conductors connecting them as shown by a plurality of elliptic arrows in FIG. 5. In this case, the sensitivity distribution on the plane cut at the center of the coil has nodes where sensitivity becomes substantially zero in the vicinity of the first circumference as shown in FIG. 6. The sensitivity in the area between the circumference of the first radius and the circumference of the second radius increases, and the sensitivity in the center of the coil is also high to some extent and uniform at the same time. In the same way with the case of birdcage type resonance, such a sensitivity distribution is preferable for MRI imaging on an inspection target located inside the first circumference.

Next, adjustment of a resonance frequency of the RF coil will be explained.

The resonance frequency of an inductor/capacitor resonation circuit is generally proportional to $1/\sqrt{(LC)}$. Here, since the inductance value L is determined by the size and shape of the coil, by adjusting the value of each capacitor according to the resonance frequency of the nuclide to be inspected, the apparatus can be operated in two tuning modes. That is, the tuning frequency of an MRI signal is precisely determined both by the nuclide to be inspected and by the magnitude of the static magnetic field, whereas the inductance value L that determines the resonance frequency of the coil is determined by the size and shape of the coil, and therefore the combined capacitance values necessary for each tuning mode is properly determined when the nuclide to be inspected are determined.

The combined capacitance when birdcage type resonance has occurred is expressed by following Formula (1) assuming that the capacitance of the capacitor 204 inserted in the linear conductor 200 is C1, the capacitance of the capacitor 205 inserted in the linear conductor 201 is C2, and the capacitance of the capacitor 206 inserted in the ring conductors 202, 203 is C3.

$$C_{LP}=(C1+C2)/2, C_{HP}=C3 \tag{1}$$

$C_{LP}$ in Formula (1) represents the capacitance of the capacitor when a low pass type birdcage type coil is assumed, $C_{HP}$ represents the capacitance of the capacitor when a high pass type birdcage type coil is assumed.

On the other hand, when tuning in the multiple patch resonator type mode takes place, currents flow along small loops formed by neighboring linear conductors and some of the upper/lower ring parts as shown in FIG. 5. The capacitors inserted in these small loops can be assumed as a series arrangement of the four capacitors 204, 205 and two 206 capacitors. Therefore, the combined capacitance $C_{MPR}$ of the capacitor related to the tuning frequency is as shown in Formula (2) below.

$$1/C_{MPR}=1/C1+1/C2+2/C3 \tag{2}$$

Therefore, by estimating a preferable combined capacitance $C_{LP}$ or $C_{HP}$ and $C_{MPR}$ for both of the two tuning modes of the birdcage type and multiple patch resonator type and adjusting the capacitance of each capacitor so as to satisfy Formula (1) and Formula (2), the desired two resonance frequencies can be realized. When adjusting the capacitances of the capacitors, the capacitances can be calculated relatively easily if they are calculated based on a model in small loops, and therefore it is practical to estimate the combined capacitance according to Formula (2) first and then adjust it so as to satisfy Formula (1).

Figure 7:
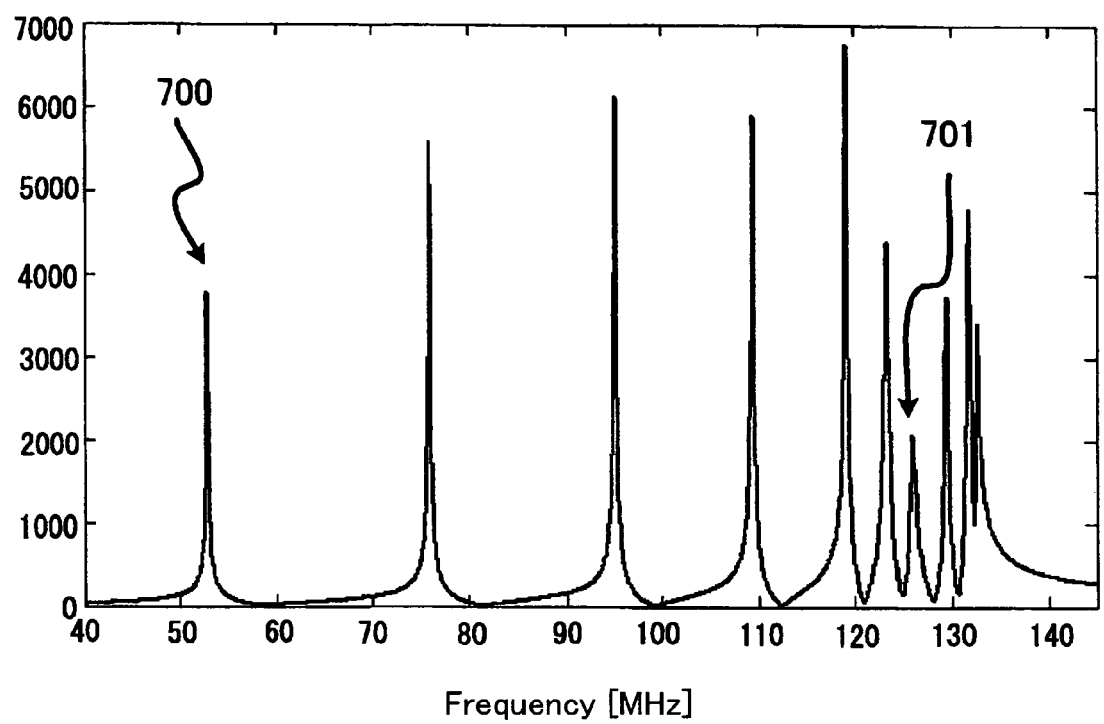
FIG. 7 is a graph showing an impedance characteristic of the coil according to the first embodiment.

According to the coil apparatus of this embodiment, the birdcage type tuning mode normally appears on the low frequency side and the multiple patch resonator type mode appears on the high frequency though this also depends on the values of the capacitors. FIG. 7 shows a typical impedance characteristic of the coil of this embodiment. An impedance peak 700 on the low frequency side is the peak in the birdcage type resonance mode and a peak 701 on the high frequency side is a peak in the multiple patch resonator type mode.

Figure 8:
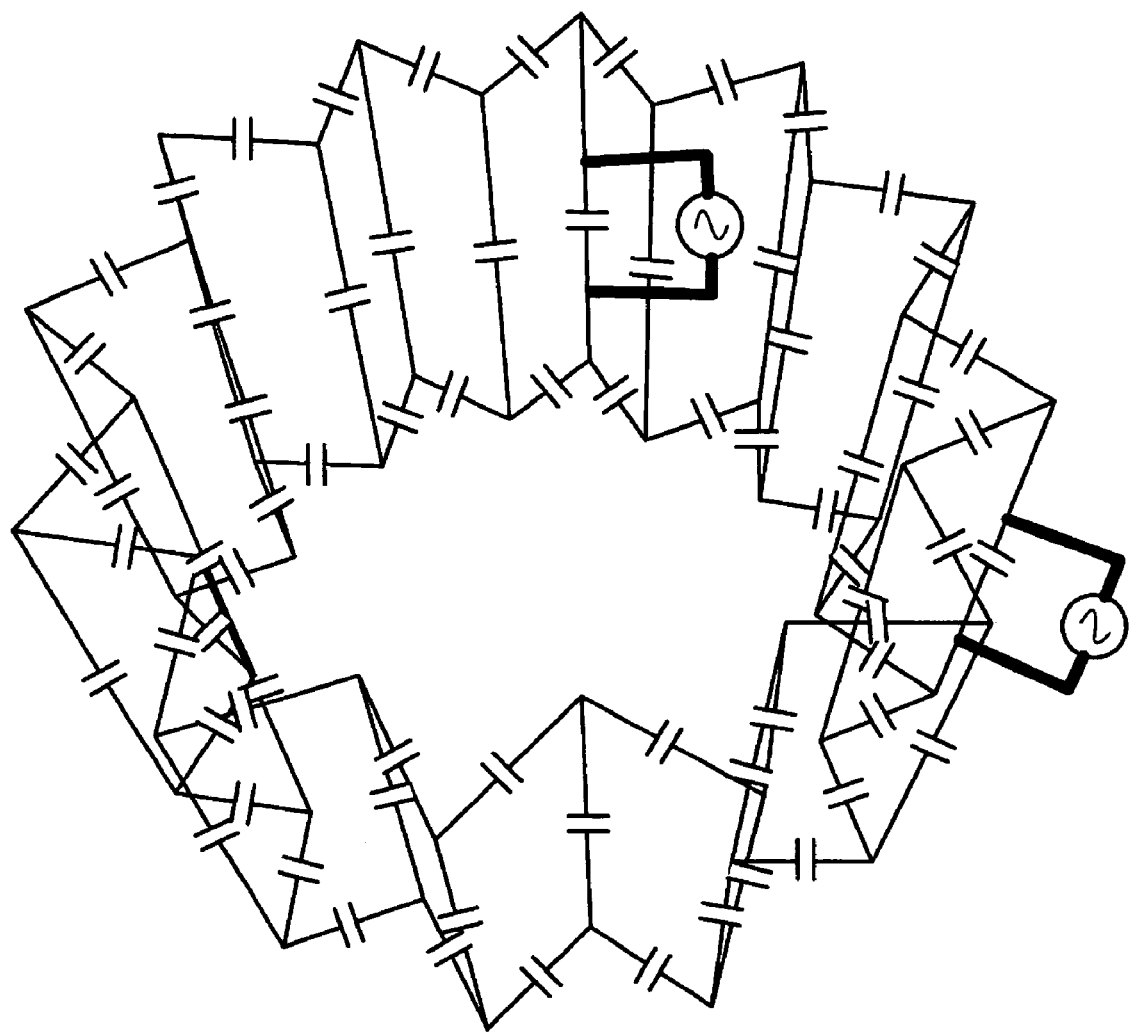
FIG. 8 shows an example of the power supply method for the coil apparatus of the present invention.
Figure 9:
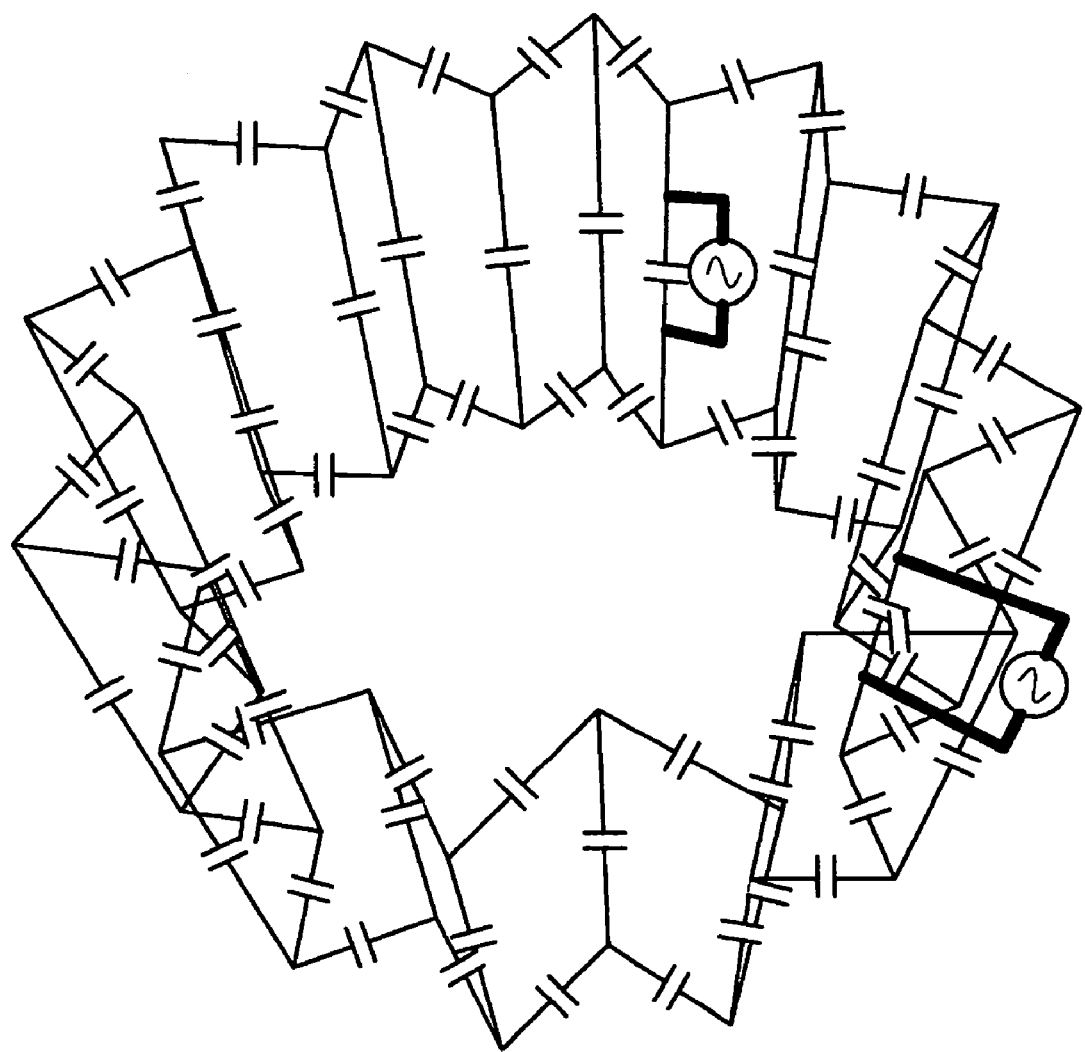
FIG. 9 shows another example of the power supply method for the coil apparatus of the present invention.

Next, the configuration when circuits for supplying and receiving electromagnetic wave, in other word, radio frequency (RF) power and signal, are added to the coil of this embodiment will be explained. FIGS. 8 and 9 show an example of circuits for supplying and receiving RF signal. Since RF power supply and RF signal reception are often configured in the same circuit configuration, only RF power supply will be illustrated here.

RF power is generally supplied using a method called "linear polarization feed" and a method called "circular polarization feed" and any one of these methods may be adopted. According to the method called "linear polarization feed" there is only one feed point and an AC radio wave is supplied in parallel with one capacitor 205 inserted in one of the plurality of outside linear conductors 201. According to this method, the polarized wave in the electromagnetic field produced inside the coil is a linearly polarized wave. As shown in FIG. 8, with the circular polarization feed, in addition to the first feed point provided in parallel with the capacitor, RF power is also supplied to the capacitor located at a position shifted by 90 degrees viewed from the cylindrical axis direction. An AC radio wave shifted by ¼ wavelength from the wavelength at the first feed point is supplied to this second feed point. In that case, the polarized wave produced inside the coil is a circularly polarized wave. That is, the current flow shown in FIG. 3 starts to rotate centered on the cylindrical axis. When circular polarization feed is adopted, sensitivity and efficiency of the MRI apparatus are improved compared to the linearly polarized wave.

FIG. 8 shows an example where power is supplied to the linear conductor located outside, while FIG. 9 shows a case where power is supplied to the linear conductor located inside. When the case where power is supplied outside is compared to the case where power is supplied inside, the case where power is supplied inside often results in higher sensitivity.

As explained above, according to the coil apparatus of this embodiment, one coil in a relatively simple circuit configuration can tune at two different frequencies. Furthermore, in both the birdcage type tuning mode and multiple patch resonator type mode, sensitivity in the vicinity of the center of the coil shows good uniformity and transmission efficiency is high. Furthermore, when used as the transmission coil, and also when a power amplifier capable of covering two frequencies is used, the space occupied by the coil can be reduced compared with a case where two transmission coils and two transmission power amplifiers for each two frequencies are prepared separately and the number of power amplifiers consuming large power can also be reduced. Furthermore, it is also possible to save time and to avoid trouble to replace the coil for every measurement of two frequencies without any time and trouble to reinstall the measurement target into each coils.

When the coil of this embodiment is applied as the RF coil of an MRI apparatus, it is not appropriate to distinguish which coil of the five embodiments including the second to fifth embodiments which will be described later in each of cases of a coil for reception, coil for transmission and coil for both transmission and reception. Rather, each embodiment should be selected based on the combination of frequencies used and ease of manufacturing.

Furthermore, the coil apparatus of this embodiment has a high degree of freedom of frequency adjustment, requires less space occupied by the coil and is particularly suitable as the RF coil of an MRI apparatus. For example, this embodiment allows an MRI apparatus to simultaneously image signal from nuclide other than hydrogen such as phosphorus, carbon and sodium and a signal from hydrogen and can provide images of good quality with uniform sensitivity.

A cylindrical coil apparatus as in the case of the coil apparatus of this embodiment has sensitivity to an electromagnetic wave component having a polarized wave in a direction perpendicular to the cylindrical axis, and therefore the coil apparatus is preferably set so that the cylindrical axis is substantially parallel to the direction of the static magnetic field of the MRI apparatus. Therefore, the coil apparatus of this embodiment is suitable for an MRI apparatus under a horizontal magnetic field scheme where the body axis direction of an examinee is normally equal to the direction of the static magnetic field (horizontal).

The first embodiment of the coil apparatus according to the present invention has been explained so far, and the shape of the coil apparatus of the present invention and components of the coil apparatus may be modified in various ways. Hereinafter, other embodiments where the arrangement of capacitors in the coil apparatus in the first embodiment is changed will be explained with reference to FIG. 10 to FIG. 13. In the coil apparatuses shown in FIG. 10 to FIG. 13, the structure made up of a plurality of linear conductors and star ring conductors is the same as that of the first embodiment. In the figures, feed points or power receiving points are omitted.

Second Embodiment

Figure 10:
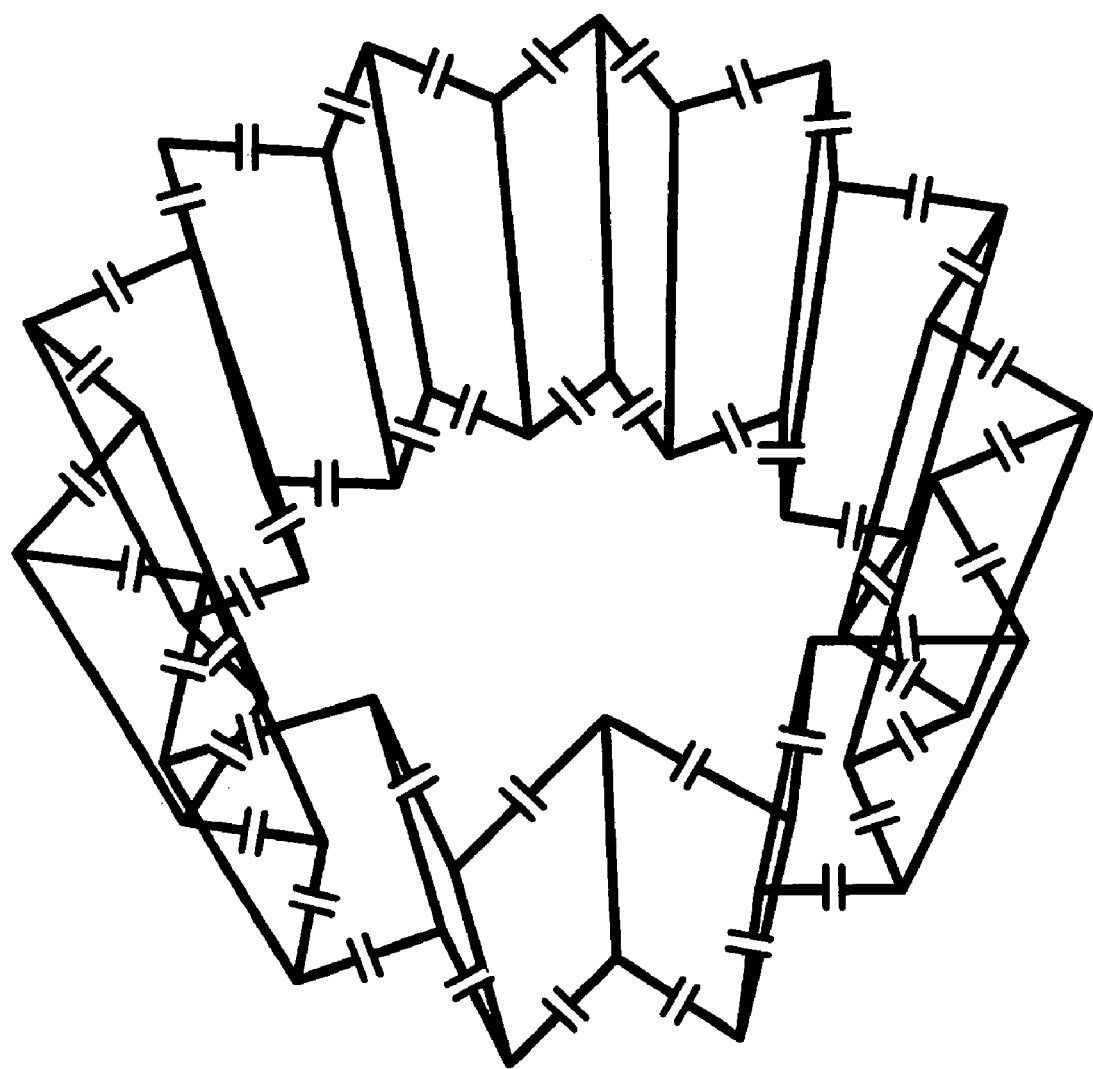
FIG. 10 shows a second embodiment of the coil apparatus of the present invention.

FIG. 10 shows a coil apparatus according to a second embodiment. This coil apparatus is different in that capacitors 206 exist only on upper and lower sides of star ring conductors and no capacitor is provided for a plurality of linear conductors. In this case, since a combined capacitance is determined only by the capacitance of the capacitors 206, the degree of freedom in setting two resonance frequencies is decreased. As shown in FIG. 7, the impedance characteristic of the coil apparatus according to the first embodiment is such that a peak in the birdcage type resonance mode appears on the low frequency side and a peak in the multiple patch resonator type mode appears on the high frequency side, but on the contrary, according to this embodiment, a birdcage type resonance mode appears on the high frequency side, while a resonance mode having sensitivity nodes in the vicinity of the circumference of the first radius appears on the low frequency side. The frequency characteristic in the birdcage type resonance mode is of a high pass type and the birdcage type mode is suitable for transmission/reception of a high frequency signal having a relatively high resonance frequency. Though the coil apparatus of this embodiment has a lower degree of freedom in setting two frequencies, it is better than the first embodiment in that the number of parts is less. Though the degree of freedom in adjusting the resonance frequency using the capacitors is low, by changing an inductance L by changing the shape of the coil and the number of conductors or the like, it is possible to realize a resonance frequency according to nuclides of the MRI apparatus.

Furthermore, in the case of this embodiment, feed points are arranged in parallel with at least one of the capacitors arranged on the upper and lower sides of the ring conductors.

Third Embodiment

Figure 11:
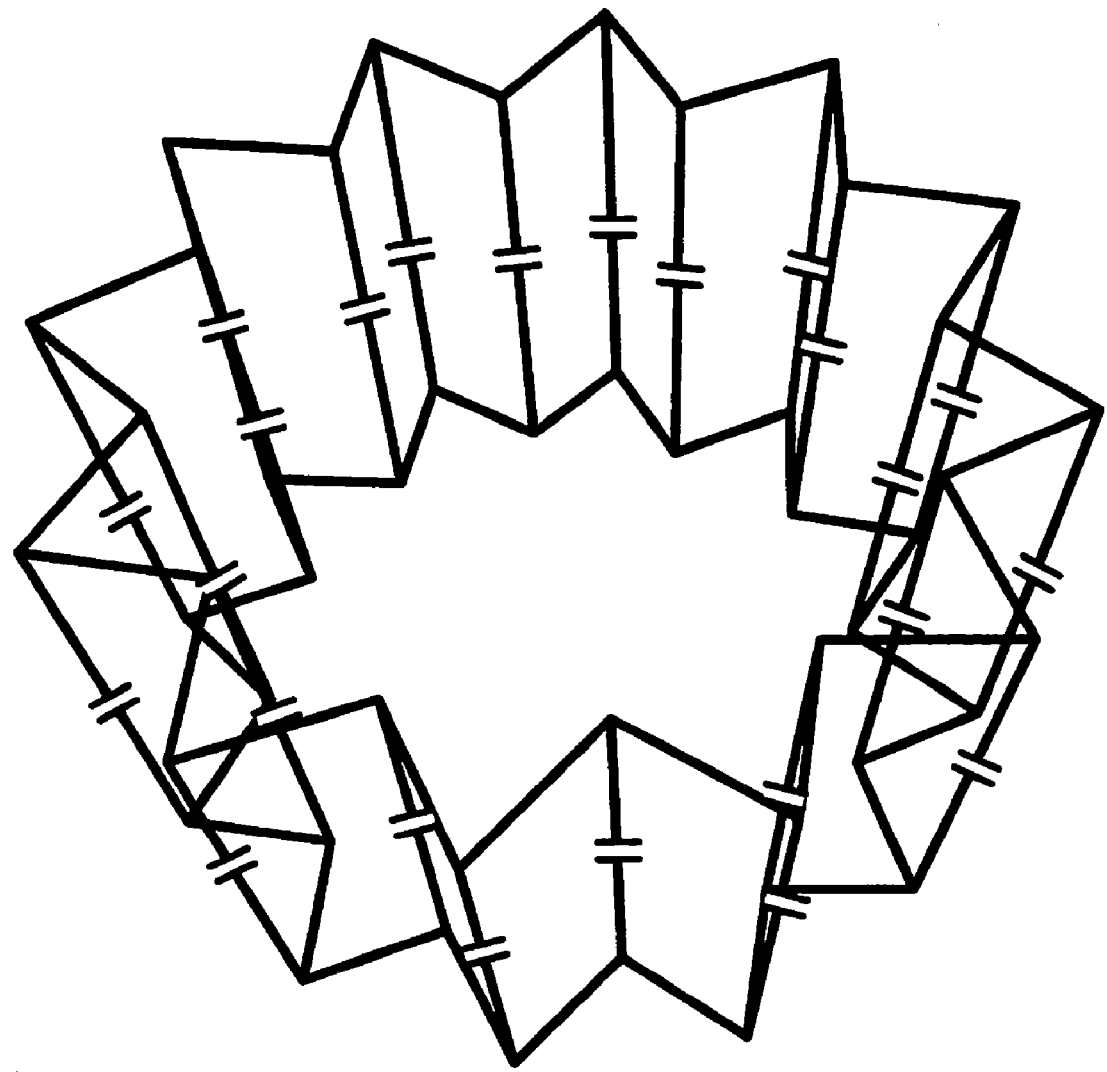
FIG. 11 shows a third embodiment of the coil apparatus of the present invention.

The coil apparatus shown in FIG. 11 is different only in that capacitors 204, 205 exist only on a plurality of linear conductors and no capacitor is provided for ring parts. The combined capacitance is also determined only by the capacitances of the capacitors 204, 205 in this case, and therefore the degree of freedom in setting two resonance frequencies decreases. In the impedance characteristic of this coil apparatus, as in the case of the first embodiment, a peak in a birdcage type resonance mode appears on the low frequency side and a peak in a multiple patch resonator type mode appears on the high frequency side. The frequency characteristic in the birdcage type resonance mode is of a low pass type and the birdcage type mode is suitable for detection of a signal having a relatively low resonance frequency.

Though the coil apparatus of this embodiment has a low degree of freedom in setting two frequencies, it is better than the first embodiment in that the number of parts is less. By changing an inductance L by changing the shape of the coil and the number of conductors or the like, it is possible to realize a resonance frequency according to nuclides of the MRI apparatus in this case, too.

Fourth Embodiment

Figure 12:
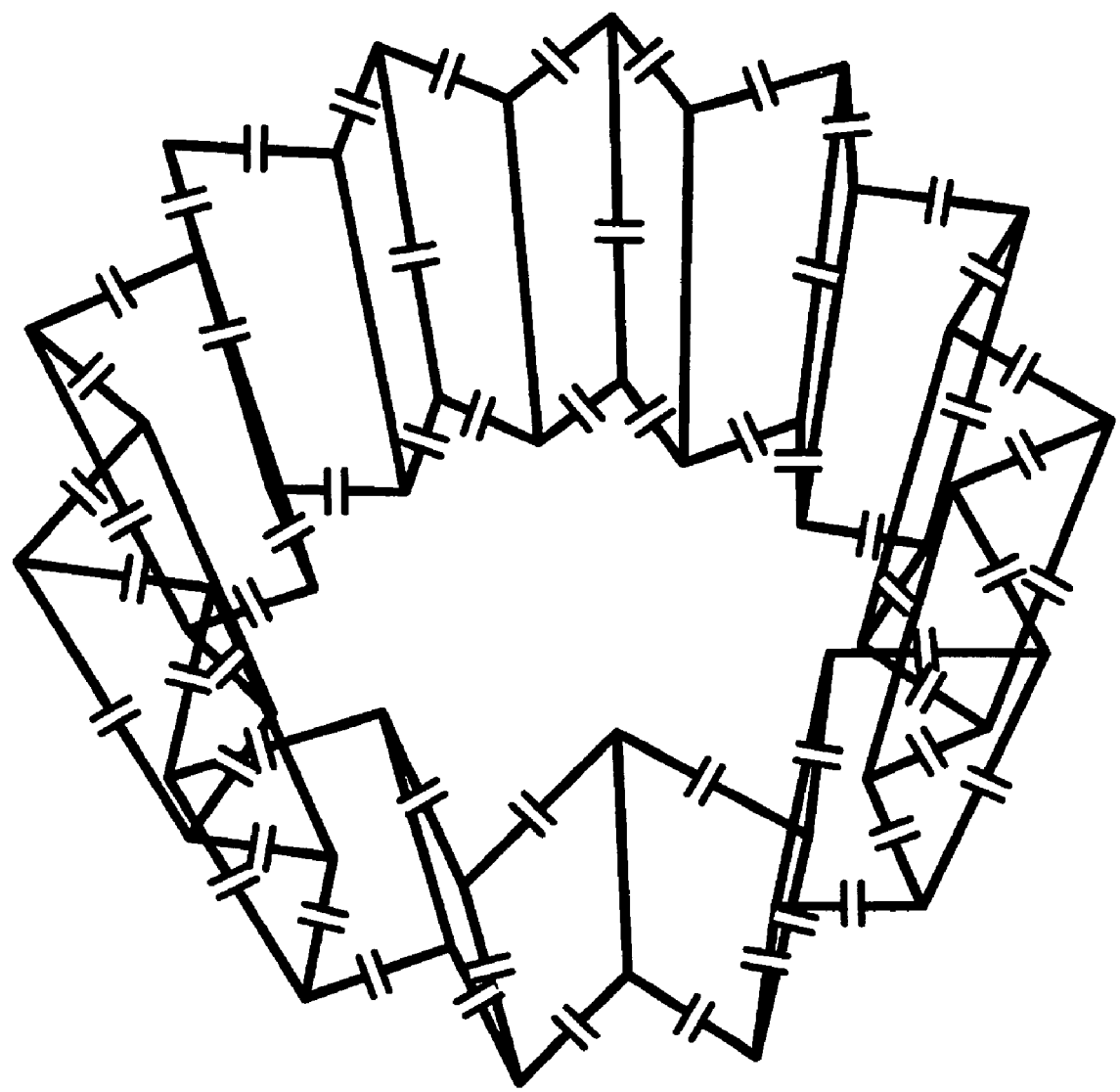
FIG. 12 shows a fourth embodiment of the coil apparatus of the present invention.

The coil apparatus shown in FIG. 12 is different from the first embodiment in that capacitors are provided only for linear conductors arranged outside out of a plurality of linear conductors and no capacitor is provided for linear conductors arranged inside. Capacitors are arranged on upper and lower star ring parts.

The coil apparatus of this embodiment allows two resonance frequencies to be set substantially freely. Compared to the first embodiment, sensitivity at high frequency multiple patch resonator type resonance points is low, but sensitivity at a low frequency side birdcage type resonance frequency is excellent, and therefore this embodiment is suitable for transmission/reception of a signal of a relatively low frequency.

Fifth Embodiment

Figure 13:
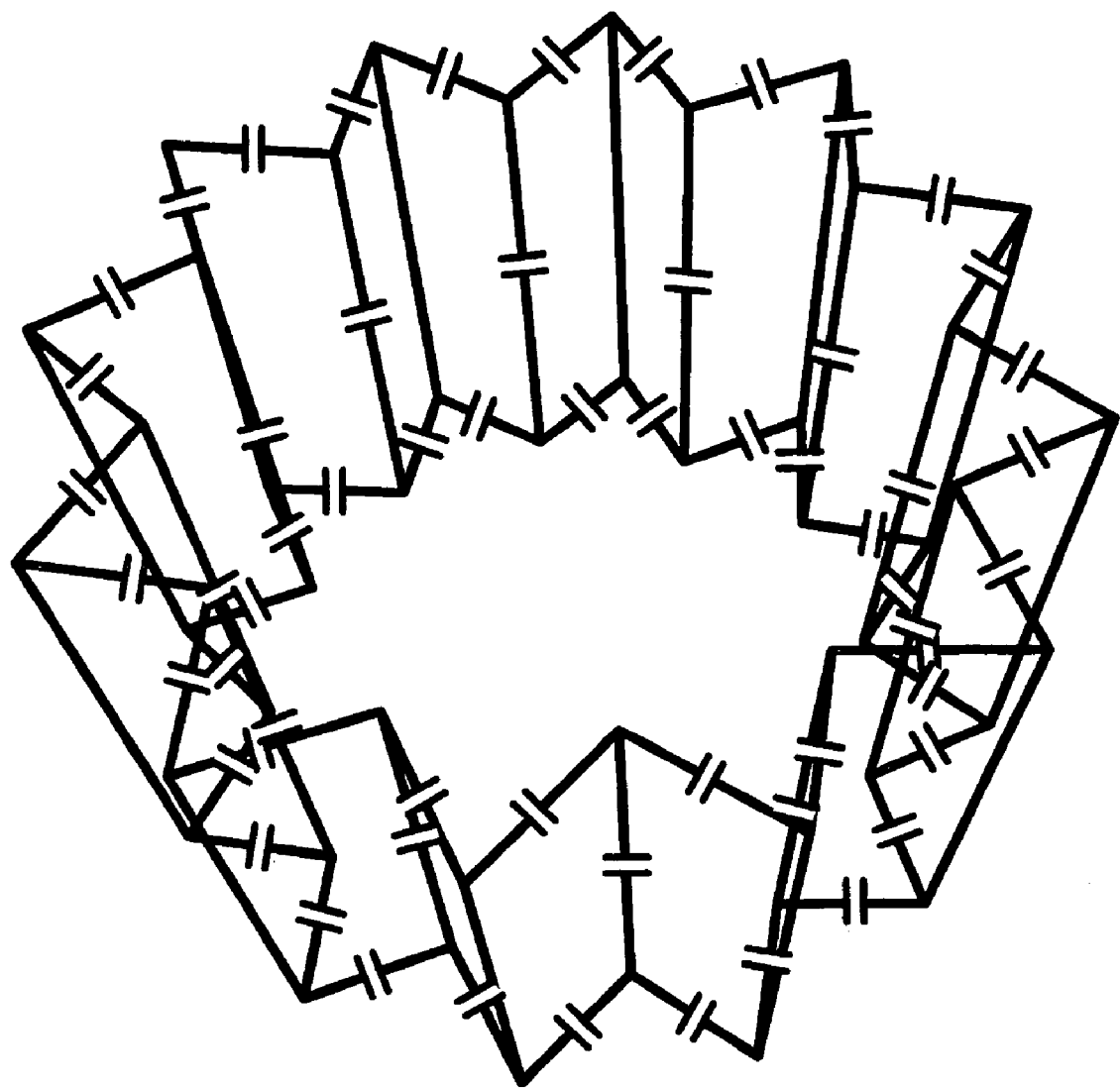
FIG. 13 shows a fifth embodiment of the coil apparatus of the present invention.

The coil apparatus shown in FIG. 13 is different from the first embodiment in that capacitors are provided only for linear conductors arranged inside out of a plurality of linear conductors and no capacitor is provided for linear conductors arranged outside. Capacitors are arranged on upper and lower star ring parts.

The coil apparatus of this embodiment allows two resonance frequencies to be set substantially freely. Compared to the first embodiment, sensitivity at a high frequency side multiple patch resonator type resonance frequency is excellent.

Figure 14:
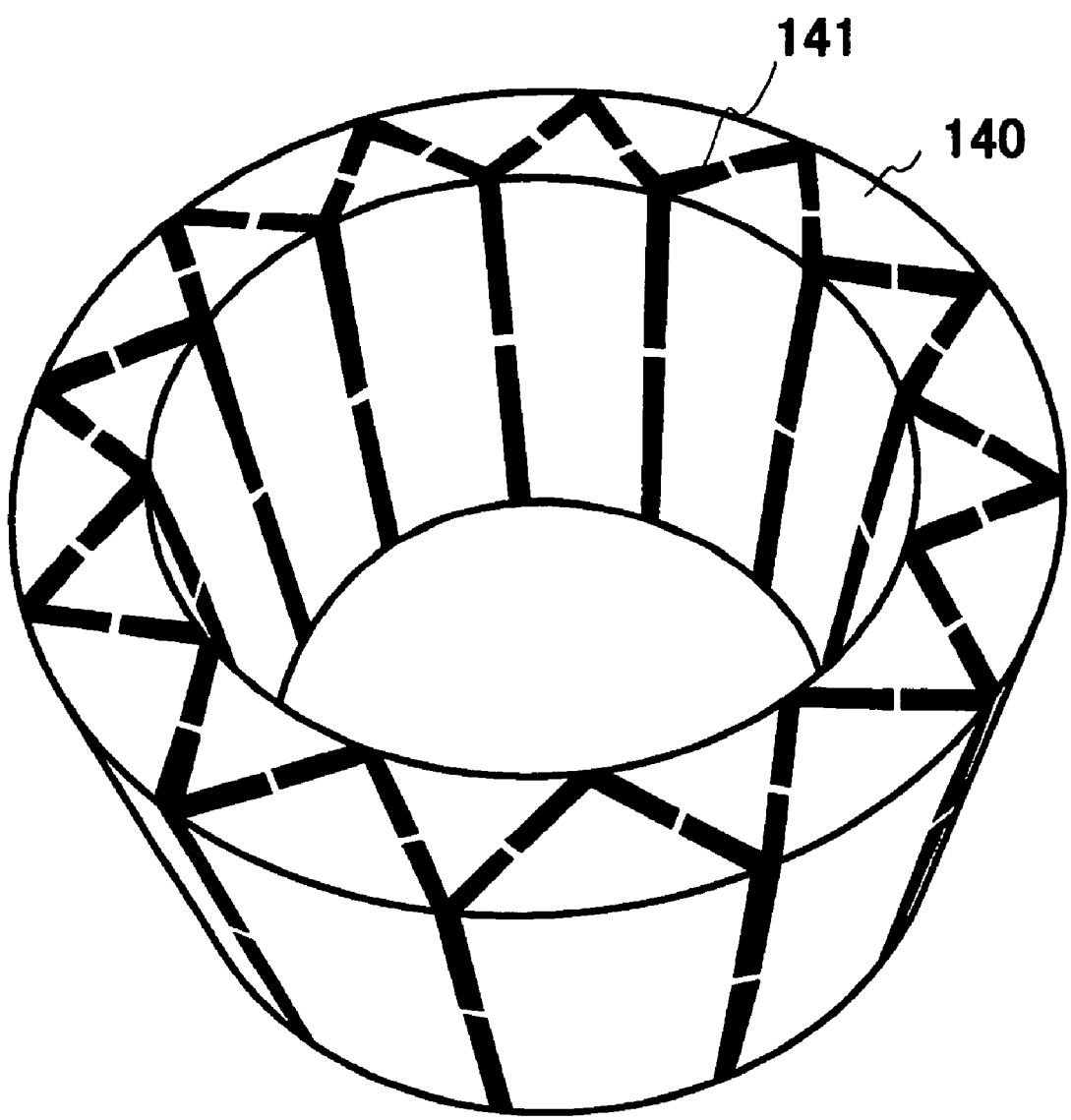
FIG. 14 illustrates an example of the method for creating the coil apparatus of the present invention.

Next, an example of the method of creating the coil shape in the above described embodiments is shown in FIG. 14.

First, a cylindrical structure 140 consisting of a circumference of a first radius as an inner surface and a circumference of a second radius as an outer surface is created using a non-magnetic substance such as plastic. The coil can be created by attaching conductors 141 cut in a Y-figure shape from a copper sheet as thin as 0.1 mm using double-faced adhesive tape or the like to the cylindrical structure 140. As shown in FIG. 14, the Y-figured conductors 141 are arranged with gaps having a size equivalent to the size of capacitors provided between each other and capacitors are placed in those gaps. The Y-figured conductors 141 may also be made of metal wires or metal bars instead of metal sheet.

The first embodiment and embodiments having the same structure yet with different capacitor arrangements have been explained so far. The capacitor placement method and the power supply method explained in the first embodiment vary in the optimum configuration mode depending on the application for which the coil apparatus of the present invention is applied, for example, the RF system configuration of the MRI apparatus and are selected and adopted as appropriate. Furthermore, many derivative combinations may be adopted using the above described configuration as a basis.

Furthermore, the shape and linear conductors or the like of the coil apparatus according to the first to fifth embodiments can also be changed in accordance with the scheme of the MRI apparatus and the shape of the inspection target. For example, though the figure shows the cylindrical RF coil, the shape of the cross section perpendicular to the central axis may also be modified into an elliptical or oval shape or the like. Furthermore, one ring conductors may be made larger than the other ring conductors to transform the shape into a hollow truncated cone or circular board shape. In this case, two coils of the same figure may be combined and arranged above and below or to the left and to the right of the examinee. Since the truncated cone or substantially circular coil can detect (or generate) a magnetic field in a direction substantially parallel to the linear conductors, it is possible to arrange these coils above and below the examinee and apply the coils to an MRI apparatus having a vertical magnetic field.

Next, the second embodiment of the MRI apparatus according to the present invention will be explained. Though the MRI apparatus shown in FIG. 1 uses the coil apparatus of the present invention as a dual-purpose transmission/reception RF coil, the MRI apparatus of this embodiment is provided with a reception-only coil and a transmission-only coil, and the coil apparatus of the present invention can also be used as the reception-only coil and/or transmission-only coil.

Figure 15:
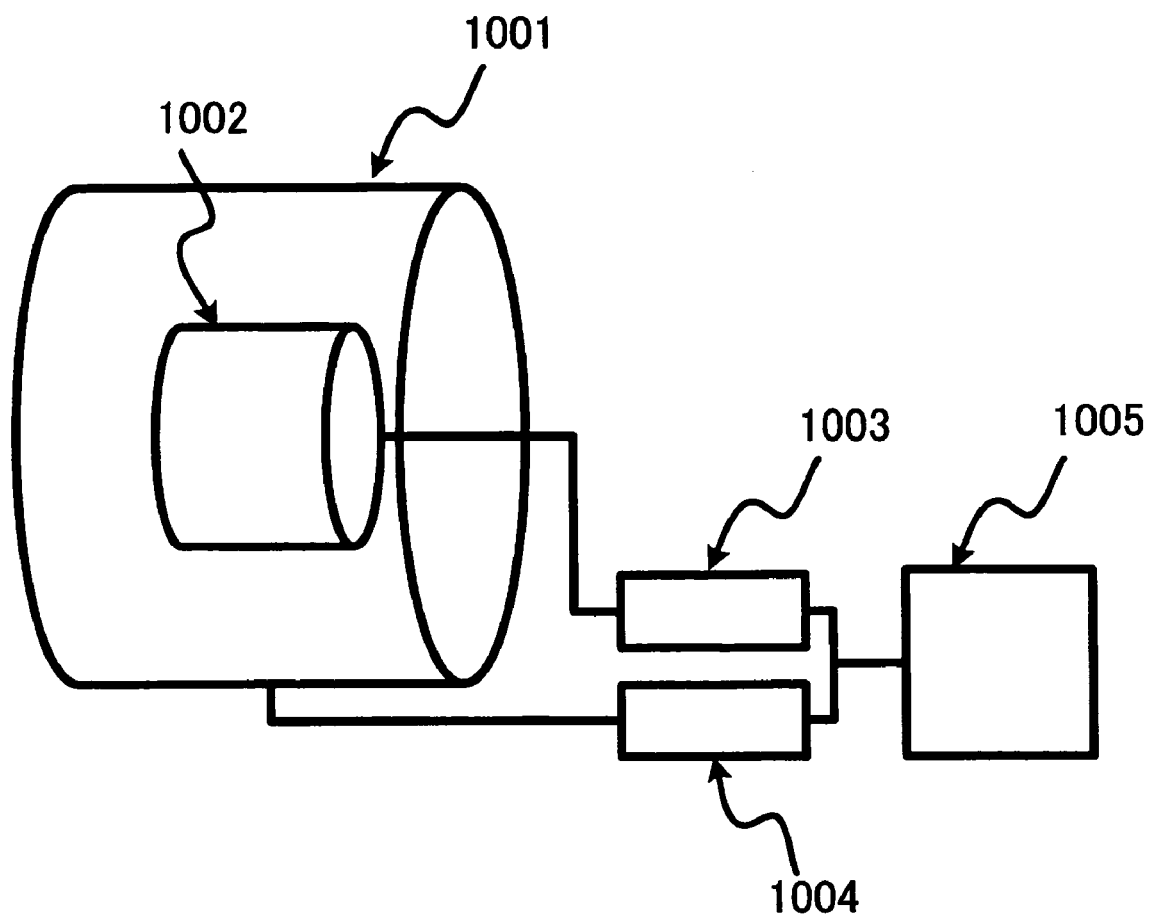
FIG. 15 shows another embodiment of the MRI apparatus to which the present invention is applied.

FIG. 15 shows the configuration when the coil apparatus of the present invention is used as a transmission-only coil 1001 or a reception-only coil 1002 of the MRI apparatus. Since the magnet that generates a static magnetic field, magnet that generates a gradient magnetic field, gradient magnetic field power supply and display are installed in the same way as FIG. 1, they are omitted in FIG. 15.

Both the RF coils 1001 and 1002 are installed in a static magnetic field. The RF coil 1001 is a coil for transmission and connected to a transmitter 1004. The RF coil 1002 is a coil for reception and connected to a receiver 1003. The receiver 1003 and transmitter 1004 are connected to a data processing section/operation section 1005.

In one embodiment of the MRI apparatus in FIG. 15, the reception-only coil 1002 is constructed of the coil apparatus according to the present invention as shown in FIGS. 2, 8 and 9. The RF coil 1001 can be constructed of a publicly known birdcage type coil or multiple patch resonator type coil. As described above, the coil apparatus of the present invention is made up of a plurality of linear conductors coupled by two star ring members arranged at a certain distance from each other so as to allow external electromagnetic waves to enter. Therefore, it is possible to irradiate an electromagnetic wave from the RF coil 1001 into the body of the examinee to which the reception-only coil 1002 is attached without blocking transmission from the RF coil 1001. In this case, it is possible to receive a nuclear magnetic resonance signal in a tuning mode at a frequency corresponding to the frequency of the electromagnetic wave irradiated from the RF coil 1001.

Another embodiment of the MRI apparatus in FIG. 15 uses the RF coil of the present invention as the transmission-only coil 1001. In this case, the coil apparatus as shown in FIG. 2, 8, 9 or the like is used as the transmission-only coil 1001 and this coil apparatus is connected to two lines of transmitter 1004 corresponding to two frequencies through a transmission/reception changeover switch (not shown). Furthermore, two types of coils having tuning modes of different frequencies are prepared as the reception-only coil 1002. This makes it possible to selectively apply high frequency pulses of two frequencies to an inspection target and inspect different nuclides.

A further embodiment of the MRI apparatus in FIG. 15 uses the coil apparatus of the present invention as the transmission-only coil 1001 and reception-only coil 1002. Furthermore, since the coil apparatus of the present invention has a high degree of freedom of frequency adjustment, by adjusting the capacitance of capacitors inserted in the linear conductors and capacitors inserted in the ring conductors, it is possible to configure coils of different sizes and shapes and thereby combine coils having the same resonance frequency yet in different sizes or shapes. In this case, the transmission-only coil 1001 is connected to two lines of transmitter 1004 through a transmission/reception changeover switch as in the case of the above described embodiment.

According to this embodiment, it is possible to easily inspect two types of nuclides without making the apparatus more complicated or requiring work of replacement of coils or the like.

EXAMPLES

Example 1

An example will be explained where an RF coil having 24 linear conductors, and upper and lower star rings as shown in FIG. 2 is installed in an MRI apparatus having a static magnetic field strength of 3 tesla to acquire hydrogen and phosphorus signals.

The coil design in this example assumes that the length in the axial direction is 220 mm, the outer diameter equivalent to twice the second radius is approximately 350 mm and the inner diameter equivalent to twice the first radius is approximately 260 mm. Furthermore, the coil design also assumes that the values of both the capacitors 204, 205 arranged on the linear conductors are 12 pF and the values of the capacitors 206 arranged on the upper and lower star ring parts are 500 pF. The conductors are assumed to be made of copper bars having a radius of 4 mm and the conductivity of copper is used as the conductivity value.

The resonance characteristic of this RF coil was determined by a simulation and the result is as shown in FIG. 7. In FIG. 7, the horizontal axis shows a frequency and the vertical axis shows impedance. The impedance was determined by simulating a case where linear polarization feed is performed in parallel with one capacitor. A maximum peak of impedance corresponds to a resonance point.

As shown in FIG. 7, a plurality of peaks appear in the RF coil of this example. Among them, approximately ten peaks appearing within a range of frequency 50 to 135 MHz are resonance peaks characteristic to a band pass type birdcage type coil close to a low pass type and a peak 700 around approximately 52 MHz is a tuning peak having a high degree of uniformity of sensitivity over a wide range of the inner region of the coil. 52 MHz corresponds to a tuning frequency of phosphorus in an MRI apparatus having a static magnetic field strength of 3 tesla.

Furthermore, the fourth peak of 128 MHz from the high frequency side indicated by an arrow 701 is another tuning peak which has a sensitivity node in the vicinity of the first radius and has uniform sensitivity over a wide range of the coil inner region. 128 MHz substantially corresponds to a tuning frequency of hydrogen in the MRI apparatus of 3 tesla.

As characteristically shown in FIG. 7, in the mode of the coil in the present invention, it has been observed that a birdcage type resonance mode appears on the low frequency side of the impedance characteristic graph and a multiple patch resonator type resonance mode having sensitivity nodes in the vicinity of the circumference of the first radius appears on the high frequency side.

Next, the sensitivity inside the coil was examined at respective tuning frequencies in the birdcage type resonance mode and resonance mode having sensitivity nodes in the vicinity of the circumference of the first radius (multiple patch resonator type mode). The sensitivity on a cross section cut at the center of the coil perpendicular to the central axis of the cylindrical coil was determined by a simulation. The result is shown in FIG. 4 and FIG. 6.

FIG. 4 shows a sensitivity map at birdcage type resonance points of 52 MHz and FIG. 6 shows a sensitivity map at resonance points in a multiple patch resonator type mode of 128 MHz. The unit of contours of the sensitivity map is $A/(m\sqrt{W})$. The central area of the sensitivity map in the birdcage type mode in FIG. 4 shows uniform sensitivity with the value of approximately 2.3.

The central area of the sensitivity map at resonance points in the multiple patch resonator type mode in FIG. 6 shows uniform sensitivity with the value of approximately 0.5. In this case, relatively strong sensitivity of on the order of 2 is obtained in the doughnut-shaped space formed between the circumference of the first radius made up of the inner linear conductors and the circumference of the second radius made up of outer linear conductors which make up the RF coil, that is, the cylindrical space which actually has a thickness. This area in the actual coil is located at the position of the casing of the coil, and so cannot be used for measurement. However, since this doughnut-shaped area plays the role of trapping electromagnetic waves in the coil, it shows a typical resonance sensitivity distribution for an ultra-high magnetic field MRI apparatus of 3 tesla or more in particular.

The above described result proves that the RF coil of the present invention can generate uniform sensitivity inside the coil at two frequencies of 52 MHz and 128 MHz.

The capacitor values shown in this example are 12 pF and 500 pF, but the two tuning frequencies can be changed in multiple ways by changing these values.

Example 2

A simulation was performed about a case where an RF coil having 24 linear conductors, and upper and lower star rings as shown in FIG. 10 was set in an MRI apparatus having a static magnetic field strength of 3 tesla. This RF coil is of a high pass type where the capacitors only exist on the upper and lower sides of star ring conductors and no capacitor is provided on the plurality of linear conductors. When a simulation was performed about impedance, assuming the same size of coil and the same material of conductor as Example 1 and assuming that values of all capacitors on the ring was 22 pF, unlike the case of Example 1 shown in FIG. 7, the impedance characteristic was such that the birdcage type resonance mode appeared on the high frequency side and the multiple patch resonator type mode appeared on the low frequency side. Furthermore, two resonance frequencies were 66 MHz and 156 MHz.

Example 3

A simulation was performed about a case where an RF coil having 24 linear conductors, and upper and lower star rings as shown in FIG. 11 was set in an MRI apparatus having a static magnetic field strength of 3 tesla. This RF coil is of a low pass type where the capacitors only exist on a plurality of linear conductors and no capacitor is provided on the ring parts. When a simulation was performed about impedance assuming the same size of coil and the same material of conductor as Example 1 and assuming that values of all capacitors on the ring was 22 pF, as in the case of Example 1, the impedance characteristic was such that the birdcage type resonance mode appeared on the low frequency side and the multiple patch resonator type mode appeared on the high frequency side. Furthermore, two resonance frequencies were 31 MHz and 98 MHz.

Example 4

A simulation was performed about a case where an RF coil having 24 linear conductors, and upper and lower star rings as shown in FIG. 12 was set in an MRI apparatus having a static magnetic field strength of 3 tesla. In this RF coil, the capacitors are arranged only on the outer linear conductors out of the plurality of linear conductors and no capacitor is provided on the inner linear conductors. The capacitors are arranged on the upper and lower star rings.

A simulation was performed about impedance and sensitivity assuming that values of capacitors for the outer linear conductors were 6.1 pF and values of the capacitors of the ring parts were 200 pF. As a result, resonance in the multiple patch resonator type mode appeared at 127 MHz and resonance having birdcage type uniform sensitivity appeared at 53 MHz. 53 MHz corresponds to a resonance frequency of phosphorus at an MRI apparatus of 3 tesla. The sensitivity value at the central part of the coil at resonance of 127 MHz which corresponds to a resonance frequency of hydrogen is approximately 0.05 A/(m$\sqrt{W}$), which was considerably low compared to Example 1, but it has been proven that the sensitivity value of the central part of resonance at 53 MHz was 2.33 A/(m$\sqrt{W}$), which was considerably high sensitivity.

Example 5

A simulation was performed about a case where an RF coil having 24 linear conductors, and upper and lower star rings as shown in FIG. 13 was set in an MRI apparatus having a static magnetic field strength of 3 tesla. In this RF coil, the capacitors are arranged only on the inner conductors out of the plurality of linear conductors and no capacitor is provided on the outer linear conductors. The capacitors are arranged on the upper and lower star ring parts.

When 6.8 pF is set as the value of the inner capacitors of the linear conductors and 200 pF is set as the value of ring part capacitors, resonance having sensitivity nodes appeared in the vicinity of the circumference having the first radius at 127 MHz and resonance having birdcage type uniform sensitivity appeared in the vicinity of 53 MHz. The sensitivity value at the central part of resonance at 53 MHz was approximately 1.9 A/(m$\sqrt{W}$) and the sensitivity value at the central part of resonance at 127 MHz was approximately 1.1 A/(m$\sqrt{W}$). As a result, though the sensitivity was inferior to sensitivity 2.3 A/(m$\sqrt{W}$) at the resonance frequency of phosphorus in Example 1, the sensitivity as much as twice sensitivity 0.5 A/(m$\sqrt{W}$) at the resonance frequency of hydrogen in Example 1 was obtained. The method in Example 5 is effective when it is preferable to give importance to sensitivity of hydrogen signals more than sensitivity of phosphorus signals.

Example 6

A simulation of impedance and sensitivity was performed with the same capacitor arrangement as in Example 5 about a case where the capacitor value of the inner linear conductors was assumed to be 6.3 pF and the capacitor arrangement of the ring part was assumed to be 530 pF. As a result, resonance frequencies were obtained at 32 MHz and 127 MHz. 32 MHz corresponds to the resonance frequency of carbon in an MRI apparatus of 3 tesla. The central sensitivity at resonance of 32 MHz was 2.6 A/(m$\sqrt{W}$) and the central sensitivity at the resonance frequency of 127 MHz was 1.0 A/(m$\sqrt{W}$).

This indicates that by adequately selecting values of two types of capacitors in Example 5, it is possible to adjust resonance between two frequencies of not only hydrogen and phosphorus but also hydrogen and carbon. Therefore, this example has proven that it is possible to design a resonance coil by selecting two frequencies useful for the MRI apparatus.

In the coil apparatus of the present invention, a single coil has two tuning modes and can receive or transmit two types of signals having different frequencies. This coil apparatus can be used as a part of the MRI apparatus and is also applicable to all kinds of equipment using electromagnetic waves having frequencies of several MHz to several GHz.

What is claimed is:

1. A coil apparatus used for signal transmission and/or reception, comprising:
   a plurality of linear conductors arranged around a central axis;
   loop-shaped first conductors connected to one respective ends of the plurality of linear conductors;
   loop-shaped second conductors connected to the respective other ends of the plurality of linear conductors; and
   capacitors arranged at least one of the linear conductors, first conductors and second conductors,
   wherein the plurality of linear conductors include a first linear conductor group and a second linear conductor group, the plane on which the first conductor group is arranged and the plane on which the second conductor group is arranged are located at a certain distance from each other, and
   the first conductors and the second conductors are connected alternately to the linear conductors making up the first linear conductor group and the linear conductors making up the second linear conductor group.

2. A coil apparatus used for signal transmission and/or reception, comprising:
   a plurality of linear conductors arranged around a central axis and in parallel with the central axis;
   loop-shaped first conductors connected to one respective ends of the plurality of linear conductors;
   loop-shaped second conductors connected to the respective other ends of the plurality of linear conductors; and
   capacitors arranged at least one of the linear conductors, first conductors and second conductors,
   wherein the first conductors and second conductors each have portions located near and far from the central axis and have rotational symmetry centered on the central axis, and
   the plurality of linear conductors are connected to the portions of the first conductors and second conductors located near and far from the central axis.

3. The coil apparatus according to claim 1, wherein the first conductors and second conductors are polygons having apices whose apex angle is less than 180 degrees and apices whose apex angle exceeds 180 degrees alternately, and
   the linear conductors are connected to the apices of the polygon.

4. The coil apparatus according to claim 2, wherein the first conductors and second conductors are polygons having apices whose apex angle is less than 180 degrees and apices whose apex angle exceeds 180 degrees alternately, and
   the linear conductors are connected to the apices of the polygon.

5. The coil apparatus according to claim 1, wherein the first conductors and second conductors are polygons each having first apices located on a first arc having a first radius centered on the central point and second apices located on a second arc having a second radius centered on the central point, and the first apices and second apices are arranged alternately.

6. The coil apparatus according to claim 2, wherein the first conductors and second conductors are polygons each having first apices located on a first arc having a first radius centered on the central point and second apices located on a second arc having a second radius centered on the central point, and the first apices and second apices are arranged alternately.

7. The coil apparatus according to claim 1, wherein capacitors are arranged on the first conductors and second conductors.

8. The coil apparatus according to claim 2, wherein capacitors are arranged on at least one of the plurality of linear conductors.

9. The coil apparatus according to claim 1, wherein first capacitors are arranged on the first conductors and second conductors and second capacitors are arranged on at least one of the plurality of linear conductors.

10. The coil apparatus according to claim 2, wherein first capacitors are arranged on the first conductors and second conductors and second capacitors are arranged on at least one of the plurality of linear conductors.

11. The coil apparatus according to claim 9, wherein capacitors are arranged on only any one of the first linear conductor group and the second linear conductor group.

12. The coil apparatus according to claim 10, wherein capacitors are arranged on only any one of the first linear conductor group and the second linear conductor group.

13. The coil apparatus according to claim 1, wherein power supplying/signal receiving means is provided in parallel with at least one of the capacitors.

14. The coil apparatus according to claim 2, wherein power supplying/signal receiving means is provided in parallel with at least one of the capacitors.

15. A magnetic resonance imaging apparatus comprising:

static magnetic field generating means for generating a static magnetic field;

a transmission RF coil, disposed in a space of the static magnetic field generated by the static magnetic field generating means, for generating a high-frequency magnetic field in a direction perpendicular to the static magnetic field direction;

a reception RF coil that detects a high frequency magnetic field in a direction perpendicular to the static magnetic field direction; and means for imaging internal information of the examinee using a nuclear magnetic resonance signal generated from the examinee placed in the space of the static magnetic field and detected by the reception RF coil, wherein the coil apparatus according to any one of claims 1 to 14 is provided as the transmission RF coil and/or the reception RF coil.

16. A magnetic resonance imaging apparatus comprising:

static magnetic field generating means for generating a static magnetic field;

an RF coil, disposed in a space of the static magnetic field generated by the static magnetic field generating means, for generating a high-frequency magnetic field in a direction perpendicular to the static magnetic field direction and detecting a high-frequency magnetic field in a direction perpendicular to the static magnetic field direction; and means for imaging internal information of the examinee using a nuclear magnetic resonance signal generated from the examinee placed in the space of the static magnetic field and detected by the reception RF coil, wherein the coil apparatus according to any one of claims 1 to 14 is provided as the RF coil.

17. The magnetic resonance imaging apparatus according to claim 15, wherein the RF coil comprises first and second tuning modes having different frequencies, and the capacitors are adjusted so that any one of the first and second tuning modes tunes a resonance frequency of hydrogen nucleus and the other tunes a resonance frequency of any nucleus other than hydrogen.

18. The magnetic resonance imaging apparatus according to claim 16, wherein the RF coil comprises first and second tuning modes having different frequencies, and the capacitors are adjusted so that any one of the first and second tuning modes tunes a resonance frequency of hydrogen nucleus and the other tunes a resonance frequency of any nucleus other than hydrogen.

* * * * *